(12) United States Patent
Marcantoni

(10) Patent No.: US 9,575,126 B2
(45) Date of Patent: Feb. 21, 2017

(54) ITEM OF FURNITURE HAVING AN ACTUATING SYSTEM FOR ADJUSTING AT LEAST ONE MOVABLE ELEMENT

(75) Inventor: Egidio Marcantoni, Pesaro (PU) (IT)

(73) Assignee: Ciar S.P.A. (IT)

( * ) Notice: Subject to any disclaimer, the term of this patent is extended or adjusted under 35 U.S.C. 154(b) by 0 days.

(21) Appl. No.: 13/885,277

(22) PCT Filed: May 31, 2012

(86) PCT No.: PCT/EP2012/060299
§ 371 (c)(1),
(2), (4) Date: May 14, 2013

(87) PCT Pub. No.: WO2012/171807
PCT Pub. Date: Dec. 20, 2012

(65) Prior Publication Data
US 2014/0091745 A1    Apr. 3, 2014

(30) Foreign Application Priority Data

Jun. 16, 2011    (DE) .................... 20 2011 050 467 U

(51) Int. Cl.
*H02P 1/00* (2006.01)
*G01R 31/34* (2006.01)
*A47C 1/024* (2006.01)
*A47C 1/034* (2006.01)
*A47C 20/04* (2006.01)

(52) U.S. Cl.
CPC ........... *G01R 31/343* (2013.01); *A47C 1/0242* (2013.01); *A47C 1/034* (2013.01); *A47C 20/043* (2013.01)

(58) Field of Classification Search
CPC ...................................... F16H 59/00
USPC ......... 74/335; 362/23.17; 318/490, 565, 478
See application file for complete search history.

(56) References Cited

U.S. PATENT DOCUMENTS

| | | | |
|---|---|---|---|
| 5,894,207 A * | 4/1999 | Goings ................. | B60N 2/002 318/478 |
| 5,904,658 A * | 5/1999 | Niederauer et al. .......... | 600/587 |
| 6,106,576 A * | 8/2000 | Fromson ........................ | 318/16 |
| 6,252,363 B1 * | 6/2001 | Grady ....................... | B60R 1/07 318/244 |
| 7,126,296 B1 * | 10/2006 | Burlak et al. ................. | 318/280 |

(Continued)

FOREIGN PATENT DOCUMENTS

| | | |
|---|---|---|
| WO | 2009055432 A2 | 4/2009 |
| WO | 2009114249 A2 | 9/2009 |

*Primary Examiner* — Eduardo Colon Santana
*Assistant Examiner* — Devon Joseph
(74) *Attorney, Agent, or Firm* — Renner Kenner Greive Bobak Taylor & Weber

(57) ABSTRACT

An item of furniture includes at least one movable element and an actuating system for adjusting the movable element. The actuating system includes at least one linear actuator, a power supply unit and a manual control device. The power supply unit and the manual control device are electrically connected to the linear actuator, which has a diagnostic system having at least one illuminated indicator for indicating the functioning of the three components. The diagnostic system allows the user or a repair service to determine which of the three components is faulty, so that only the faulty component has to be replaced. Repair costs can be reduced significantly. The replacement of one of the three components can also then be carried out without difficulty by the user or a repair service.

8 Claims, 2 Drawing Sheets

(56) References Cited

U.S. PATENT DOCUMENTS

| | | | |
|---|---|---|---|
| 2003/0095406 A1* | 5/2003 | Lebens et al. | 362/231 |
| 2003/0126936 A1* | 7/2003 | Eggleton | 74/335 |
| 2006/0087158 A1* | 4/2006 | Kramer | A47C 1/022 297/29 |
| 2007/0174965 A1* | 8/2007 | Lemire | A61G 7/005 5/600 |
| 2008/0161736 A1* | 7/2008 | Leifer | 601/134 |
| 2008/0201851 A1* | 8/2008 | Menkedick et al. | 5/611 |
| 2008/0209777 A1* | 9/2008 | Suprina | 40/1 |
| 2008/0262657 A1* | 10/2008 | Howell | A47C 20/041 700/275 |
| 2008/0289108 A1* | 11/2008 | Menkedick | A61G 7/005 5/610 |
| 2009/0079378 A1* | 3/2009 | Newman, Jr. | H02P 7/05 318/565 |
| 2009/0093742 A1* | 4/2009 | Ferber | A61H 7/004 601/112 |
| 2010/0217164 A1* | 8/2010 | Meyer et al. | 601/18 |
| 2010/0249613 A1* | 9/2010 | Hashimoto | 600/485 |
| 2012/0116591 A1* | 5/2012 | Rawls-Meehan | 700/275 |
| 2012/0313768 A1* | 12/2012 | Campbell | B60R 25/2009 340/438 |
| 2013/0138302 A1* | 5/2013 | Hara | B62J 1/08 701/49 |
| 2013/0261510 A1* | 10/2013 | Anderson | A61H 1/02 601/5 |

* cited by examiner

ITEM OF FURNITURE HAVING AN ACTUATING SYSTEM FOR ADJUSTING AT LEAST ONE MOVABLE ELEMENT

FIELD OF THE INVENTION

The invention relates to an item of furniture having an actuating system for adjusting at least one movable element.

BACKGROUND OF THE INVENTION

An increasing demand is apparent on the furniture market for items of furniture, such as chairs, armchairs, sofas, couches and beds, which are equipped with an actuating system for adjusting at least one movable element, such as, for example, the back or a foot rest.

The actuating system conventionally consists of a linear actuator, a power supply unit and a manual control device, wherein the power supply unit and the manual control device are electrically connected to the linear actuator. However, this additional technology results in an increased outlay in terms of maintenance and repair, many retail traders being unfamiliar with the electronics in items of furniture. It is apparent again and again that users or the repair service are not able to determine which of the three components (power supply unit, manual control device, linear actuator) is actually faulty, so that in many cases the actuating system as a whole is replaced, as a result of which the repair costs are unnecessarily high.

SUMMARY OF THE INVENTION

The object underlying the invention is, therefore, to provide items of furniture having an actuating system, in which it can reliably be determined in a simple and inexpensive manner which of the three components is faulty and must be replaced.

According to the invention, the object is achieved by the features of claim 1.

The item of furniture according to the invention has at least one movable element and an actuating system for adjusting the movable element, wherein the actuating system comprises at least one linear actuator, a power supply unit and a manual control device, wherein the power supply unit and the manual control device are electrically connected to the linear actuator and the linear actuator has a diagnostic system having at least one illuminated indicator for indicating the functioning of the three components.

By means of the diagnostic system, the user himself, but at the latest the repair service, is able to determine in a simple manner which of the three components is faulty, so that specifically only the faulty component has to be replaced. In that manner, any repair costs can be reduced significantly. The replacement of one of the three components can also then be carried out without difficulty by the user or a repair service.

Further embodiments of the invention are the subject-matter of the dependent claims.

According to a preferred embodiment of the invention, the illuminated indicator is formed by an LED (light-emitting diode) or an LCD (liquid crystal display). It is further conceivable for the at least one illuminated indicator to have at least two different light signals for indicating the functioning of at least two of the three components. For example, one light signal can be formed by a steady light and the other light signal by a blinking light.

It can further be provided that an illuminated indicator is connected to the power supply unit in order to indicate whether the power supply unit is connected and active. In addition, an illuminated indicator for indicating the use of the manual control device can be in electrical connection with the manual control device. In a corresponding manner, an illuminated indicator for indicating the actuation of the linear actuator can also be electrically connected to the linear actuator.

In a further embodiment of the invention, the diagnostic system has at least two illuminated indicators of different colours. It would also be conceivable, however, to provide one illuminant which can be illuminated in different colours by appropriate control. According to an exemplary embodiment, the diagnostic system has at least two illuminated indicators, wherein one is connected to the manual control device and the power supply unit and the other illuminated indicator serves to indicate the actuation of the linear actuator. It is also possible to provide two illuminated indicators for the linear actuator, in order to indicate different directions of rotation of the linear actuator.

The diagnostic system can further have an illuminated indicator connected to the power supply unit, and a blinking light circuit, a blinking light being produced on the illuminated indicator when the power supply unit is connected and active. Furthermore, the manual control device can be connected to the same illuminated indicator as the power supply unit, the manual control device having a plurality of actuating elements which are so connected to the illuminated indicator that a steady light is produced on the illuminated indicator when at least one actuating element of the manual control device is pressed.

The one or more illuminated indicators are advantageously disposed on a circuit board, in particular a printed circuit board. According to a further embodiment of the invention, the linear actuator has a housing, and the circuit board is disposed inside the housing with the illuminated indicators, the housing being transparent to the light of the illuminated indicators at least in the region of the illuminated indicators. The invention can thus be implemented in a particularly inexpensive manner; moreover, the illuminated indicators are protected by the housing of the linear actuator.

Further advantages and embodiments of the invention will be explained in greater detail below by means of the description and the drawings.

DETAILED DESCRIPTION OF THE INVENTION

Figure 1:
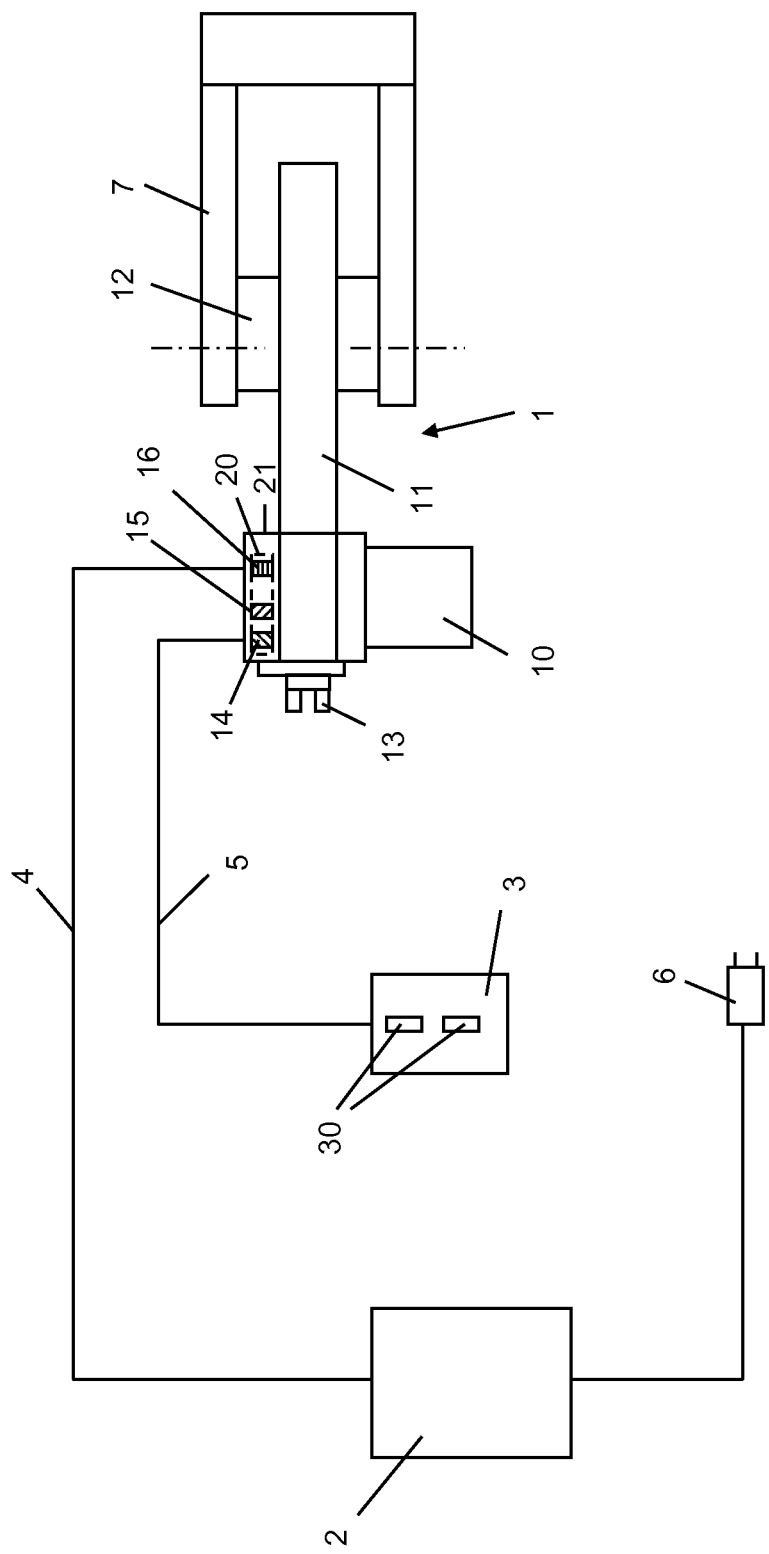
FIG. 1 shows a schematic representation of the actuating system.

The actuating system shown in FIG. 1 consists essentially of a linear actuator 1, a power supply unit 2 and a manual control device 3, the power supply unit 2 and the manual control device being electrically connected to the linear actuator 1 by way of a connecting cable 4 and a connecting cable 5, respectively. To that end, the connecting cables 4 and 5 are provided with connectors (not shown in greater detail), which can be inserted into corresponding sockets on the linear actuator 1.

The power supply unit is, for example, a transformer or a battery. The power supply unit 2 can, if required, be connected to the mains supply by way of a mains plug 6.

The linear actuator 1 is incorporated into an item of furniture (not shown in greater detail), for example an armchair, a sofa, a couch, a bed or a massage device, and serves to adjust at least one movable element (7) of the item of furniture, which movable element (7) is formed, for example, by the back of an armchair or of a sofa or of a part-region of a bed.

The linear actuator 1 shown has substantially a motor 10, a spindle 11 and a nut 12 which cooperates with the spindle. The linear actuator 1 also provides a mounting flange 13, with which it is mounted on a suitable support of the item of furniture. The movable element (7) of the item of furniture is connected to the nut 12, so that a rotary movement of the spindle 11 caused by the motor 10 effects a displacement of the nut 12 along the spindle 11 and accordingly an adjustment of the movable element (7).

The actuating system shown in FIG. 1 further has a diagnostic system with three illuminated indicators 14, 15 and 16 for indicating the functioning of the three components linear actuator 1, power supply unit 2 and manual control device 3. The illuminated indicators are preferably formed by LEDs.

Figure 2:
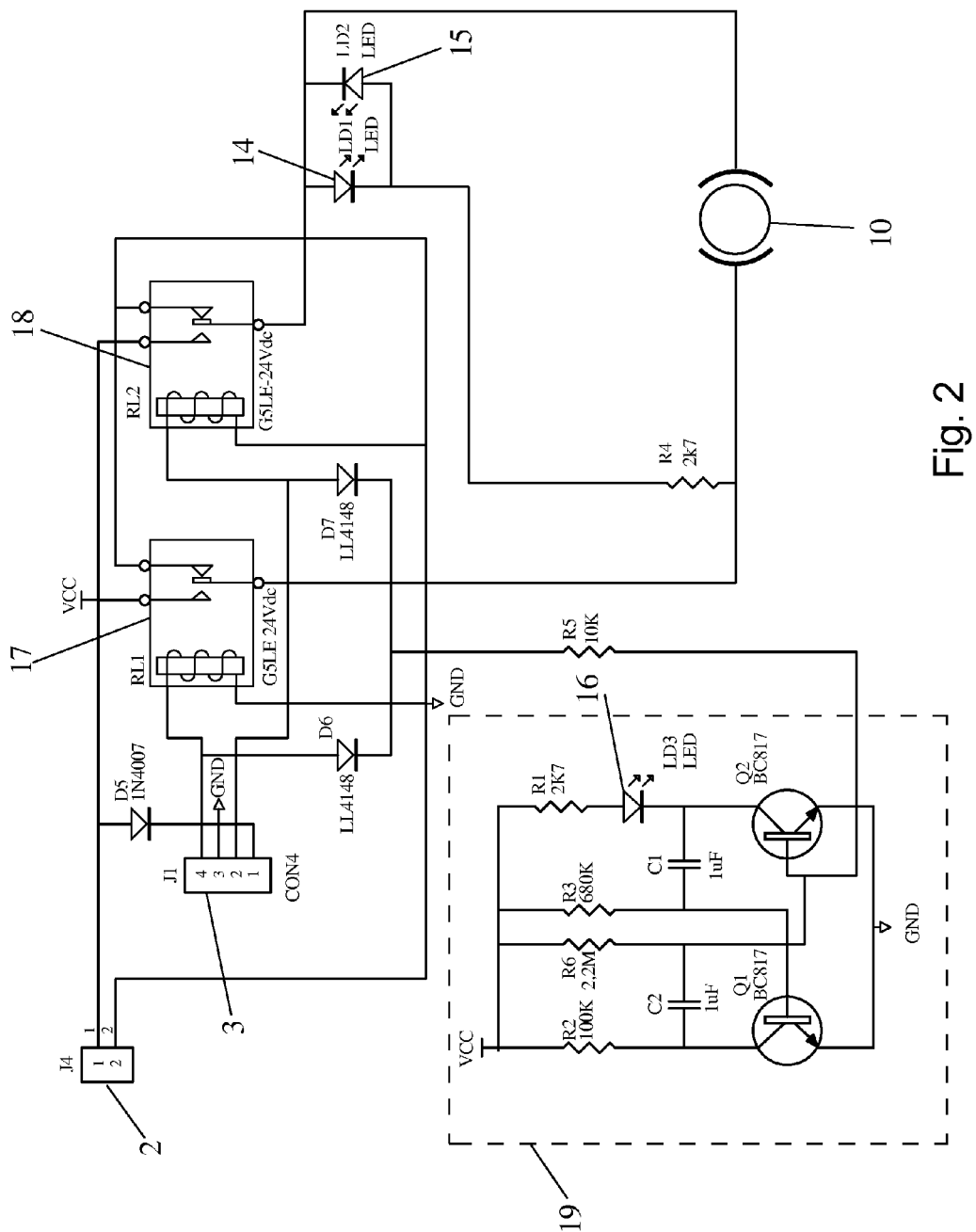
FIG. 2 shows an electric circuit of the actuating system with diagnostic system.

FIG. 2 shows the circuit diagram of the actuating device shown in FIG. 1 with the connected power supply unit 2, the manual control device 3 and the motor 10. Two relays 17 and 18 are provided for driving the motor 10 in its two directions of rotation, either the illuminated indicator 14 or the illuminated indicator 15 being illuminated, depending on the direction of rotation. In order to distinguish between the two directions of rotation, the illuminated indicators can have different colours, for example yellow and red.

There is further provided a blinking light circuit 19, which comprises substantially two transistors Q1 and Q2 and the illuminated indicator 16. The blinking light circuit 19 is electrically connected to the power supply unit 2 in such a manner that the illuminated indicator 16 blinks owing to the two transistors Q1 and Q2 when the power supply unit 2 is connected and active. Energy can be saved by the blinking illuminated indicator 16, which is advantageous in particular when a battery is used as the power supply unit 2.

The manual control device 3 has a plurality of actuating elements 30, actuation of which is likewise indicated by the illuminated indicator 16. By pressing an actuating element 30 on the manual control device 3, a constant current is applied to the transistor Q2, so that the illuminated indicator 16 is illuminated steadily. In that manner, both the operation of the manual control device 3 and the operation of the power supply unit 2 can be checked with one illuminated indicator. In order to distinguish it from the other two illuminated indicators 14, 15, the illuminated indicator 16 is formed, for example, by a green LED.

The illuminated indicators 14, 15 and 16 are advantageously disposed on a circuit board 20 inside a housing 21 of the linear actuator, the housing being transparent to the light of the illuminated indicators at least in the region of the illuminated indicators. In that manner, the illuminated indicators are reliably protected from external damage and can nevertheless be seen.

The operation and fault indication of the diagnostic system will be described in greater detail below:
Normal Operation:
A) Standby:
 Green illuminated indicator 16: blinks
 Red and yellow illuminated indicators 14, 15: not illuminated
B) Actuating element 30 for "motor up" is pressed:
 Green illuminated indicator 16: illuminated steadily
 Yellow illuminated indicator 14: illuminated
C) Actuating element 30 for "motor down" is pressed:
 Green illuminated indicator 16: illuminated steadily
 Red illuminated indicator 15: illuminated
Faults with the Power Supply Unit (Actuating System Does Not Respond at All):
Symptom: Standby operation or actuation of an actuating element 30: all illuminated indicators are off
Diagnosis: Power supply unit is faulty or mains plug 6 is not plugged in
Solution: Check the power connection. If the connection is good, the power supply unit 2 must be replaced.

For the following cases it is assumed that the power supply unit is working, i.e. illuminated indicator 16 is blinking.
Faults with the Manual Control Device 3:
Symptom: Although actuating elements 30 on the manual control device 3 are pressed, illuminated indicator 16 is not illuminated steadily (of course, illuminated indicators 14 and 15 are not illuminated in this case either)
Diagnosis: The command from the manual control device 3 is not reaching the relays 17, 18. This means that either the connecting cable 5 of the manual control device 3 or the connection on the linear actuator 1 is damaged.
Solution: Replace the manual control device. If the problem persists, the problem must lie with the socket for the manual control device 3 on the linear actuator. In that case, the linear actuator 1 must be replaced.
Symptom: One actuating element 30 is okay, but the actuation of a different actuating element does not cause illuminated indicator 16 to be illuminated steadily.
Diagnosis: Damaged actuating element 30 on the manual control device 3, damaged connecting cable 5 or damaged connection on the linear actuator 1
Solution: Replace the manual device 3. If the problem persists, the problem must lie with the socket for the manual control device 3 on the linear actuator 1. In that case, the linear actuator 1 must be replaced.

For the following cases it is assumed that the power supply unit is working, i.e. illuminated indicator 16 blinks in standby operation. It is further assumed that illuminated indicator 16 is illuminated steadily when an actuating element 30 of the manual control device 3 is pressed, and the manual control device 3 is working.
Faults with the Linear Actuator 1:
Symptom: Neither illuminated indicator 14 nor illuminated indicator 15 is illuminated and the motor 10 does not move when an actuating element 30 is pressed.
Diagnosis: Relay 17 or 18 is faulty.
Solution: Replace the linear actuator 1
Symptom: One of the two indicators 14 or 15 is illuminated but the motor does not move when an actuating element 30 of the manual control device 3 is actuated.
Diagnosis: The motor or the motor control is faulty.
Solution: Replace the linear actuator 1.

With the above-described diagnostic system, anybody can quickly and simply determine which of the three components is faulty and must be replaced. Implementation with suitable illuminated indicators, in particular in the form of coloured LEDs, is very inexpensive.

The invention claimed is:

1. Item of furniture having at least one movable element and an actuating system for adjusting the movable element, wherein the actuating system comprises a linear actuator, a power supply unit and a manual control device, and the power supply unit and the manual control device are electrically connected to the linear actuator, wherein the power supply unit is electrically connected to the linear actuator by way of a first connecting cable and the manual control device is electrically connected to the linear actuator by way of a second connecting cable, characterized in that the linear actuator includes a standby illuminated indicator and a linear actuator illuminated indicator together indicating the functioning of the at least one actuator, the power supply unit, and the manual control device, wherein the illuminated indicator is disposed on a circuit board provided in the linear actuator, wherein the illuminated indicator is connected to the power supply unit and controlled by the circuit board so as to indicate by a standby state of illumination provided by said standby illuminated indicator that the power supply unit is connected and active and the actuator system is ready for use, said standby illuminated indicator indicating the standby state through a first state of illumination and changing to a second state of illumination when the manual control device is operative and properly connected and is used to control the linear actuator, wherein the illuminated indicator is electrically connected with the manual control device and controlled by the circuit board such that, upon operation of the manual control device, failure of the standby illuminated indictor to change to said second state of illumination indicates a fault in the manual control device or a fault in the connection between the manual control device and the linear actuator effected by the second connecting cable, wherein the linear actuator illuminated indicator has different states of illumination and indicates the actuation of the at least one linear actuator by a change in said states of illumination, and the illuminated indicator is electrically connected to the linear actuator and controlled by the circuit board such that, upon operation of the manual control device, if the standby illuminated indicator changes to said second state of illumination but the linear actuator does not operate, the manual control device is known to be operative and without fault in its connection to the linear actuator due to the change of the standby state of illumination, and there is thus a fault with the linear actuator.

2. Item of furniture according to claim 1, characterized in that the standby illuminated indicator is formed by an LED or an LCD.

3. Item of furniture according to claim 1, characterized in that the standby illuminated indicator and the linear actuator illuminated indicator provide illumination of different colours.

4. Item of furniture according to claim 1, characterized in that the linear actuator illuminated indicator includes two directional illuminated indicators connected to the at least one linear actuator in order to indicate the actuation thereof in two different directions.

5. Item of furniture according to claim 1, further comprising a blinking light circuit producing a blinking light on the standby illuminated indicator to indicate the standby state of illumination.

6. Item of furniture according to claim 5, wherein the manual control device includes a plurality of actuating elements serving to actuate the linear actuator and connected to the standby illuminated indicator such that, when one of said plurality of actuating elements of the manual control device is pressed and the manual control device is operative and properly connected, the standby illuminated indicator changes to said second state of illumination, said second state of illumination being a steady light.

7. Item of furniture according to claim 1, characterized in that the linear actuator has a housing, and the circuit board, the standby illuminated indicator, and the linear actuator illuminated indicator are disposed inside the housing, the housing being transparent to the light of the illuminated indicators at least in the region of the illuminated indicators.

8. Item of furniture having at least one movable element and an actuating system for adjusting the movable element, wherein the actuating system comprises a linear actuator, a power supply unit and a manual control device, and the power supply unit and the manual control device are electrically connected to the linear actuator, wherein the power supply unit is electrically connected to the linear actuator by way of a first connecting cable and the manual control device is electrically connected to the linear actuator by way of a second connecting cable, characterized in that the linear actuator includes at least one illuminated indicator having different colors of illumination for indicating the functioning of the at least one actuator, the power supply unit, and the manual control device, wherein the at least one illuminated indicator is disposed on a circuit board provided in the linear actuator, wherein the at least one illuminated indicator is connected to the power supply unit and controlled by the circuit board so as to indicate by a standby state of illumination of a first color that the power supply unit is connected and active and the actuator system is ready for use, wherein the at least one illuminated indicator is electrically connected with the manual control device and controlled by the circuit board such that, upon operation of the manual control device, failure of the standby state of illumination to change from the first color indicates a fault in the manual control device or a fault in the connection between the manual control device and the linear actuator effected by the second connecting cable, wherein the at least one illuminated indicator is electrically connected to the linear actuator and controlled by the circuit board such that, upon operation of the manual control device, if the standby state of illumination changes from said first color but the linear actuator does not operate, the manual control device is known to be operative and without fault in its connection to the linear actuator due to the change of the standby state of illumination from said first color, and there is thus a fault with the linear actuator.

* * * * *